(12) United States Patent
Wang (10) Patent No.: US 11,158,694 B2
(45) Date of Patent: Oct. 26, 2021

(54) DISPLAY PANEL AND DISPLAY DEVICE

(71) Applicant: WUHAN TIANMA MICRO-ELECTRONICS CO., LTD., Wuhan (CN)

(72) Inventor: Baonan Wang, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 38 days.

(21) Appl. No.: 16/239,473

(22) Filed: Jan. 3, 2019

(65) Prior Publication Data
US 2019/0140025 A1    May 9, 2019

(30) Foreign Application Priority Data
Jun. 25, 2018  (CN) .......................... 201810661692.2

(51) Int. Cl.
*H01L 27/32*     (2006.01)
*H01L 51/00*     (2006.01)
(Continued)

(52) U.S. Cl.
CPC ........ *H01L 27/326* (2013.01); *H01L 27/3218* (2013.01); *H01L 27/3248* (2013.01);
(Continued)

(58) Field of Classification Search
CPC ... H01L 27/32; H01L 27/322; H01L 27/3202; H01L 27/3206; H01L 27/3211; H01L 27/3213; H01L 27/3216; H01L 27/3218; H01L 27/326; H01L 27/3248; H01L 27/3241; H01L 27/3276; H01L 27/3267; H01L 27/3265; H01L 27/329; H01L 27/3246; H01L 27/3262; H01L 2027/11824; H01L 2027/11837; H01L 2027/11859; H01L 2027/11879;
(Continued)

(56) References Cited

U.S. PATENT DOCUMENTS 9,293,092 B2 * 3/2016 Guo ..................... G09G 3/2003
2012/0218219 A1 * 8/2012 Rappoport .......... H01L 27/3288
345/174
(Continued)

FOREIGN PATENT DOCUMENTS

CN      103295525 A     9/2013
CN      104600091 A     5/2015

OTHER PUBLICATIONS

Office Action of Chinese Patent Application No. 201810661692.2 dated Mar. 27, 2020.

*Primary Examiner* — Natalia A Gondarenko
(74) *Attorney, Agent, or Firm* — Kilpatrick Townsend & Stockton, LLP (57) ABSTRACT

A display panel and a display device are provided. By simplifying the design of a part of a pixel drive circuit on a drive array substrate in a bending region of the display panel, the number of a drive transistor and other switching control tubes having the largest area in a partial region of the pixel drive circuit are reduced. Moreover, by removing an inorganic insulation layer having a larger stress, an organic buffer layer having a larger elastic modulus is filled. Therefore, the bending region has good bendability or foldability.

19 Claims, 7 Drawing Sheets

(51) Int. Cl.
*H05K 1/11* (2006.01)
*H05K 1/02* (2006.01)

(52) U.S. Cl.
CPC ......... *H01L 27/3262* (2013.01); *H05K 1/028* (2013.01); *H05K 1/118* (2013.01); *H01L 27/3276* (2013.01); *H01L 2251/5338* (2013.01)

(58) Field of Classification Search
CPC . H01L 2027/11881; H01L 2027/11883; H01L 2027/11898; H01L 2251/5338; H01L 51/0097; H01L 51/5253; H01L 27/12; H01L 27/1214–1296; H01L 27/3244–3279; H01L 27/1218; H01L 27/124; H05K 1/118; H05K 1/028; G02F 1/136286; G02F 1/1368; G02F 1/133514; G02F 1/133512; G02F 1/13624; G02F 1/1339; G02F 1/13394; G02F 1/167

USPC ...................................... 257/40, 88, E51.018
See application file for complete search history.

(56) References Cited

U.S. PATENT DOCUMENTS

| | | | |
|---|---|---|---|
| 2015/0123137 A1* | 5/2015 | Kwon | H01L 27/1218 257/72 |
| 2016/0181337 A1* | 6/2016 | Gu | H01L 27/3248 257/40 |
| 2016/0358992 A1* | 12/2016 | Ha | H01L 27/3211 |
| 2017/0213851 A1* | 7/2017 | Shishido | G02F 1/134336 |
| 2018/0182284 A1* | 6/2018 | Chung | G09G 3/3225 |
| 2018/0182838 A1* | 6/2018 | Yeo | H01L 27/3279 |
| 2018/0261160 A1* | 9/2018 | Wu | G09G 3/3233 |
| 2019/0165076 A1* | 5/2019 | Lee | H01L 27/3276 |
| 2019/0214435 A1* | 7/2019 | Yang | H01L 51/0097 |
| 2019/0377234 A1* | 12/2019 | Yu | H01L 27/1218 |

* cited by examiner

DISPLAY PANEL AND DISPLAY DEVICE

CROSS-REFERENCE TO RELATED APPLICATIONS

The present disclosure claims priority to Chinese Patent Application No. 201810661692.2, filed on Jun. 25, 2018, the content of which is incorporated herein by reference in its entirety.

FIELD

The present disclosure relates to the field of display technologies, and particularly, to a display panel and a display device.

BACKGROUND

At present, display technologies have been applied to every aspect of people's daily life, and accordingly, more and more materials and technologies have been used for display screens. Nowadays, mainstream display screens mainly include liquid crystal display screens and organic light-emitting diode display screens. Due to the self-luminous performance of the organic light-emitting diode display screens, the most energy-consuming backlight module is omitted compared with the liquid crystal display screens, so that the OLED screen may have the advantage of better energy-saving. In addition, the organic light-emitting diode display screen also has the characteristics of flexible and bendable. By using a flexible substrate, a plurality of conductive layers are sequentially formed on the flexible substrate, including a thin film transistor drive array layer, an anode layer, an organic light-emitting layer, a cathode layer, and a thin-film encapsulation layer, so that OLED display screens have excellent bendability.

As the users' requirements on flexible bendability or folding performance of the display terminal product become more and more demanding, the stability of the performance of the flexible display product and the anti-bending performance are also may be required to be higher.

SUMMARY

In view of the above, the present disclosure provides a display panel and a display device. By simplifying the design of a part of a pixel drive circuit on a drive array substrate in a bending region of the display panel, the number of a drive transistor and other switching control tubes having the largest area in a partial region of the pixel drive circuit are reduced. Moreover, by removing an inorganic insulation layer having a larger stress, an organic buffer layer having a larger elastic modulus is filled. Therefore, the bending region has good bendability or foldability.

In one embodiment of the present disclosure, a display panel is provided. The display panel has a bending region, and the bending region includes a first display unit and a second display unit; the first display unit at least includes a first pixel drive unit and a first light-emitting component arranged corresponding to the first pixel drive unit, and the first pixel drive unit includes a first drive transistor configured to drive the first light-emitting component to emit light; and the second display unit at least includes a second pixel drive unit and a second light-emitting component arranged corresponding to the second pixel drive unit; and the first drive transistor is further configured to drive the second light-emitting component to emit light.

In one embodiment of the present disclosure, a display device is provided. The display device includes any of the display panels provided in the present disclosure.

With the organic light-emitting display panel and the display device provided by the embodiments of the present disclosure, the pixel drive circuits driving the light-emitting units having a same color in two adjacent pixel drive circuits on the drive array substrate of the bending region of the display panel share a drive transistor and other switching control tubes and simultaneously share the scan gate lines, and the light-emitting signal is independently controlled to achieve a normal display, thereby greatly reducing the metal traces in one row of pixel drive circuits and reducing the area occupied by the transistors on the drive array substrate. In particular, sharing of the drive transistors saves the area ratio of the largest single transistor in the pixel drive circuit, so that the inorganic insulation layer can be replaced with the polymer organic buffer layer having better toughness in the saved area, thereby enhancing the bendability of the bending region. In addition, it is also possible to prevent the damage of transistors, metal traces or capacitors on the drive array substrate caused by a large stress generated due to the presence of the inorganic insulation layer. Moreover, the thicker organic buffer layer in the bending region can also protect the light-emitting component in the light-emitting unit on the display panel, thereby avoiding damage to the light-emitting component caused by external pressure during a bending process, and adverse effects such as deformation.

BRIEF DESCRIPTION OF DRAWINGS

Embodiments of the present disclosure, the accompanying drawings used in the embodiments are briefly described below. The drawings described below are merely a part of the embodiments of the present disclosure.

DESCRIPTION OF EMBODIMENTS

Embodiments of the present disclosure are described in details referring to the drawings.

It should be clear that the described embodiments are merely part of the embodiments of the present disclosure rather than all of the embodiments.

The terms used in the embodiments of the present disclosure are merely for the purpose of describing embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after the "/" is an "or" relation.

It should be understood that although the terms 'first', 'second' and 'third' may be used in the present disclosure to describe transistors, these transistors should not be limited to these terms. These terms are used only to distinguish the transistors from one another. For example, without departing from the scope of the embodiments of the present disclosure, a first transistor may also be referred to as a second transistor. Similarly, the second transistor may also be referred to as the first transistor.

Figure 1:
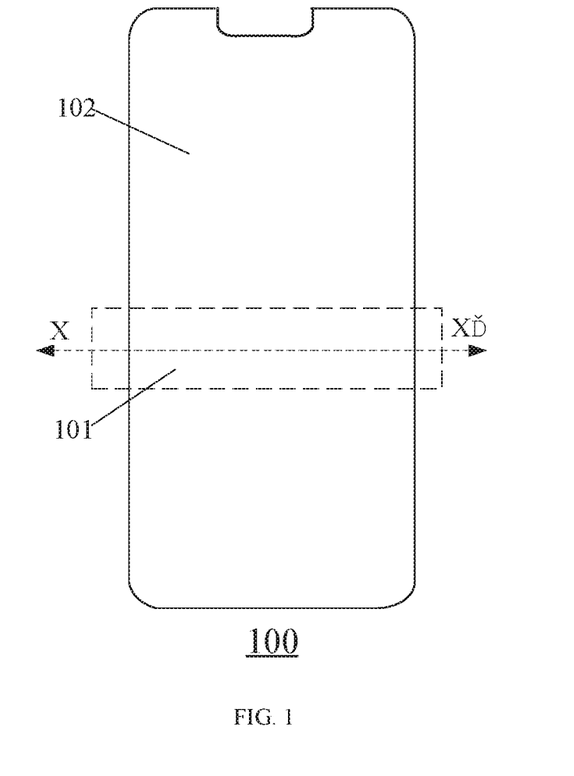
FIG. 1 is a structural schematic diagram showing a display panel according to an embodiment of the present disclosure.
Figure 2:
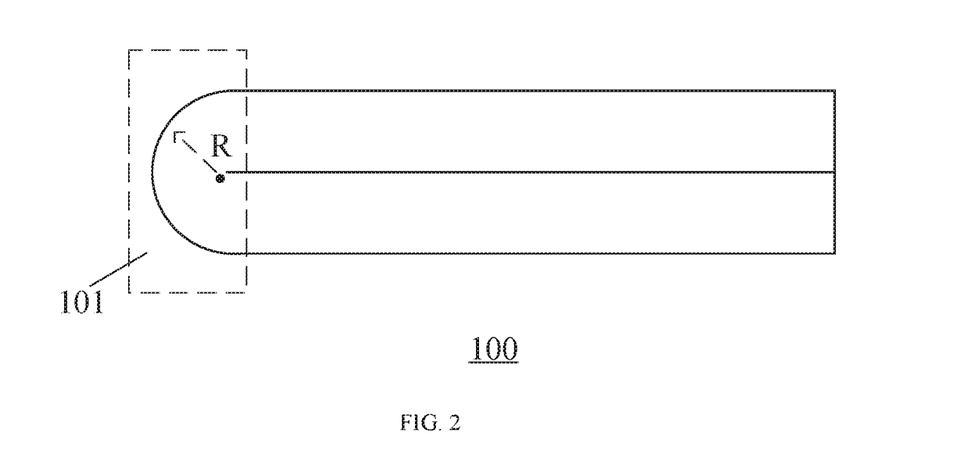
FIG. 2 is a schematic diagram showing the display panel in FIG. 1 in a bent state.
Figure 3:
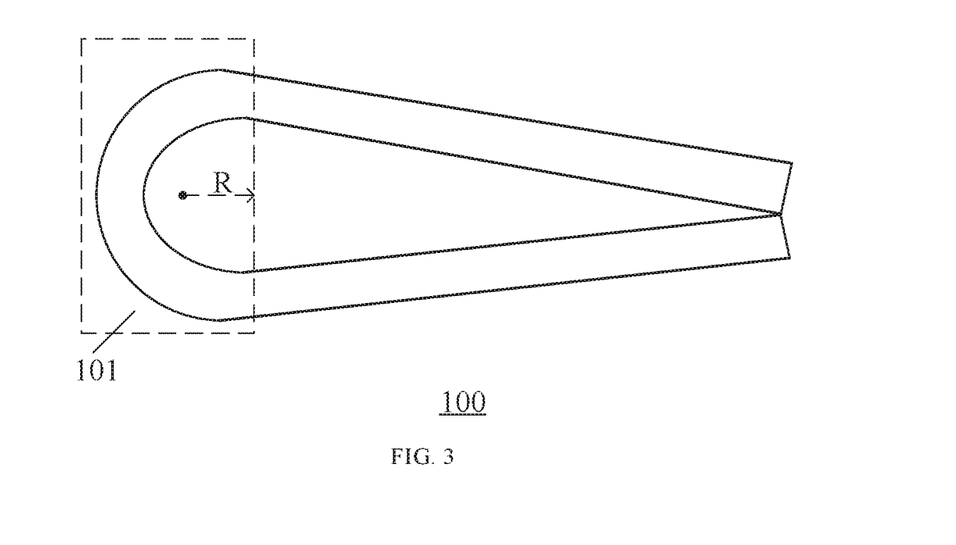
FIG. 3 is a schematic diagram showing the display panel in FIG. 1 in another bent state.
Figure 4:
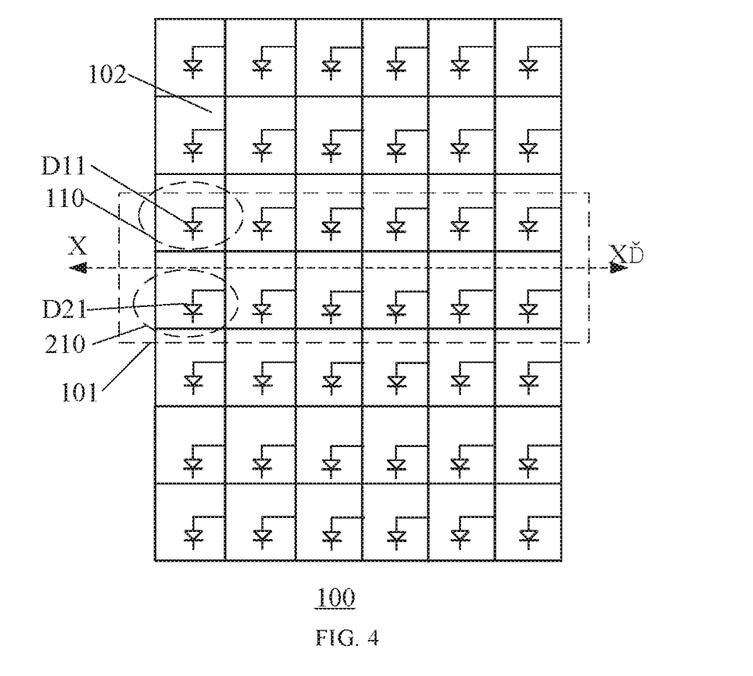
FIG. 4 is another schematic diagram showing the display panel in FIG. 1.
Figure 5:
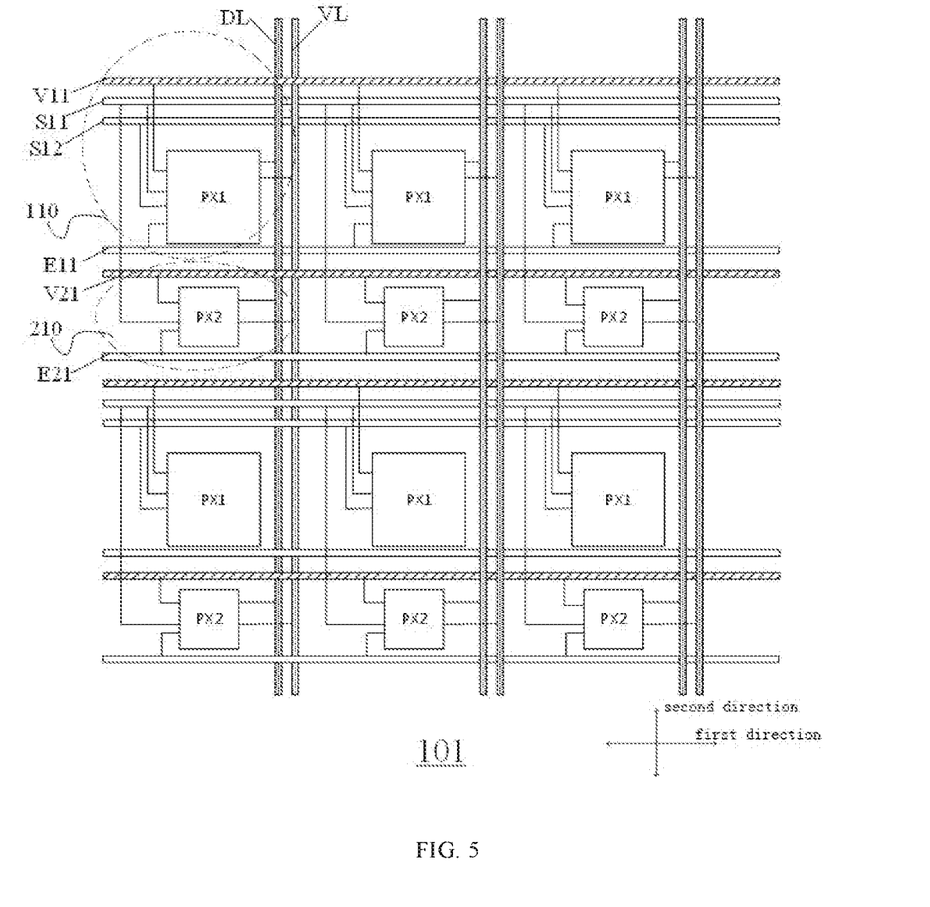
FIG. 5 is a schematic diagram showing a bending region 101 of the display panel in FIG. 1.
Figure 6:
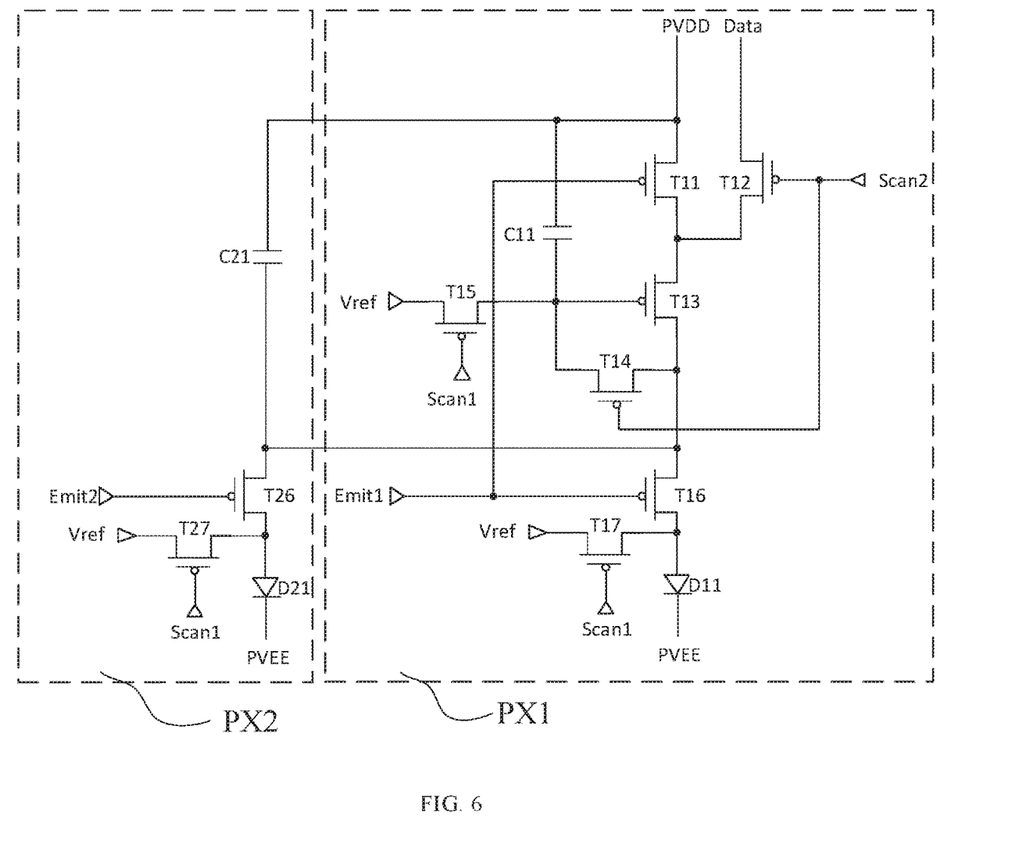
FIG. 6 is a schematic diagram of a pixel drive circuit of the bending region 101 in FIG. 5.
Figure 7:
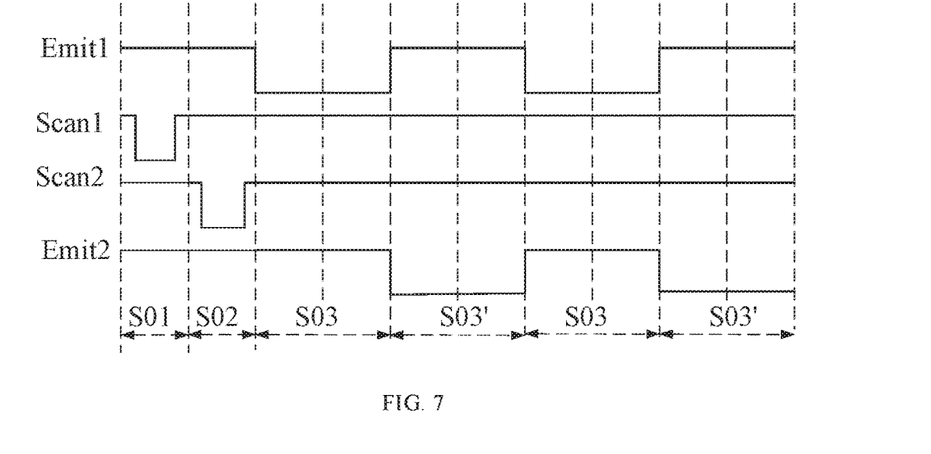
FIG. 7 is a schematic diagram showing a drive timing sequence of the pixel drive circuit in FIG. 6.
Figure 8:
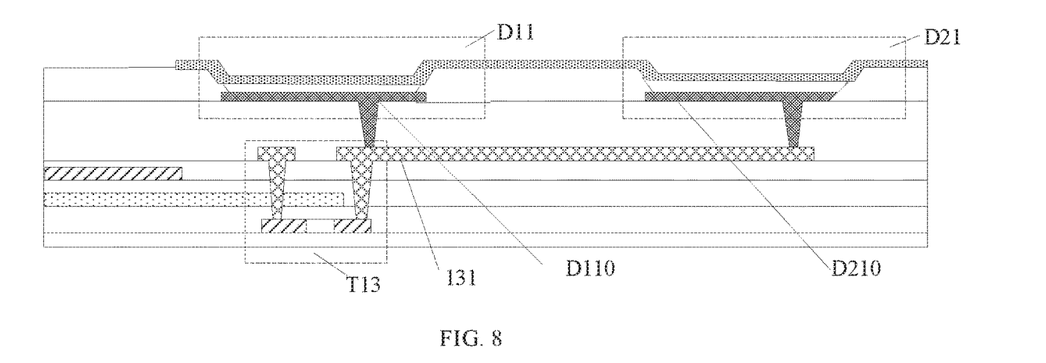
FIG. 8 is a structural schematic diagram showing a partial region of the pixel drive circuit in FIG. 6.
Figure 9:
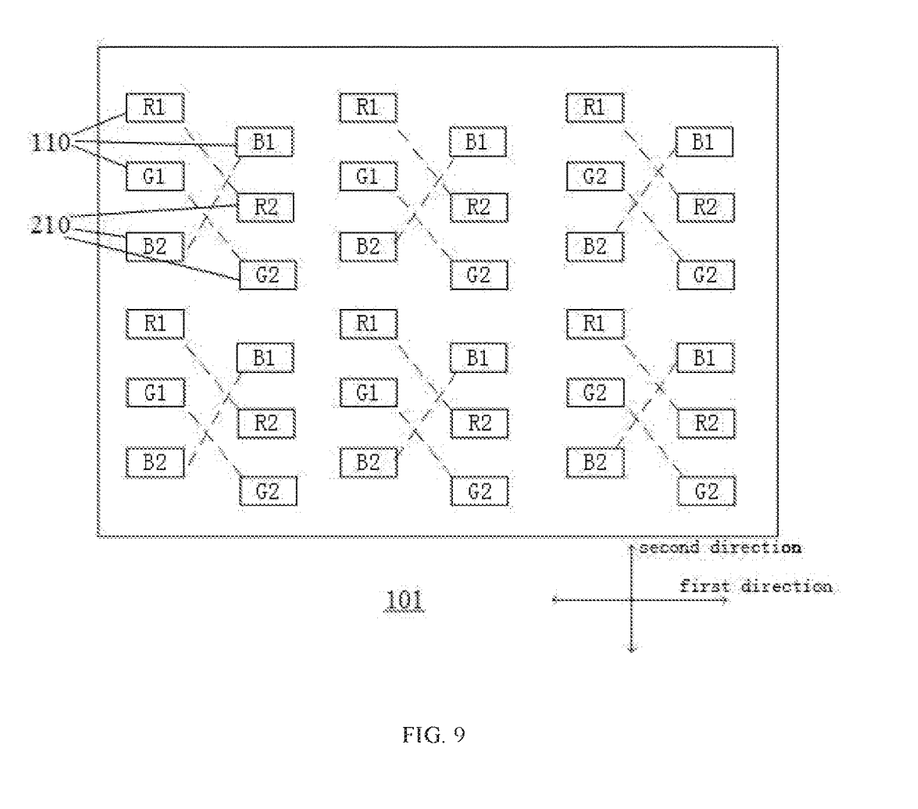
FIG. 9 is a schematic diagram showing an arrangement manner of the light-emitting units in the bending region 101 of the display panel in FIG. 1.
Figure 10:
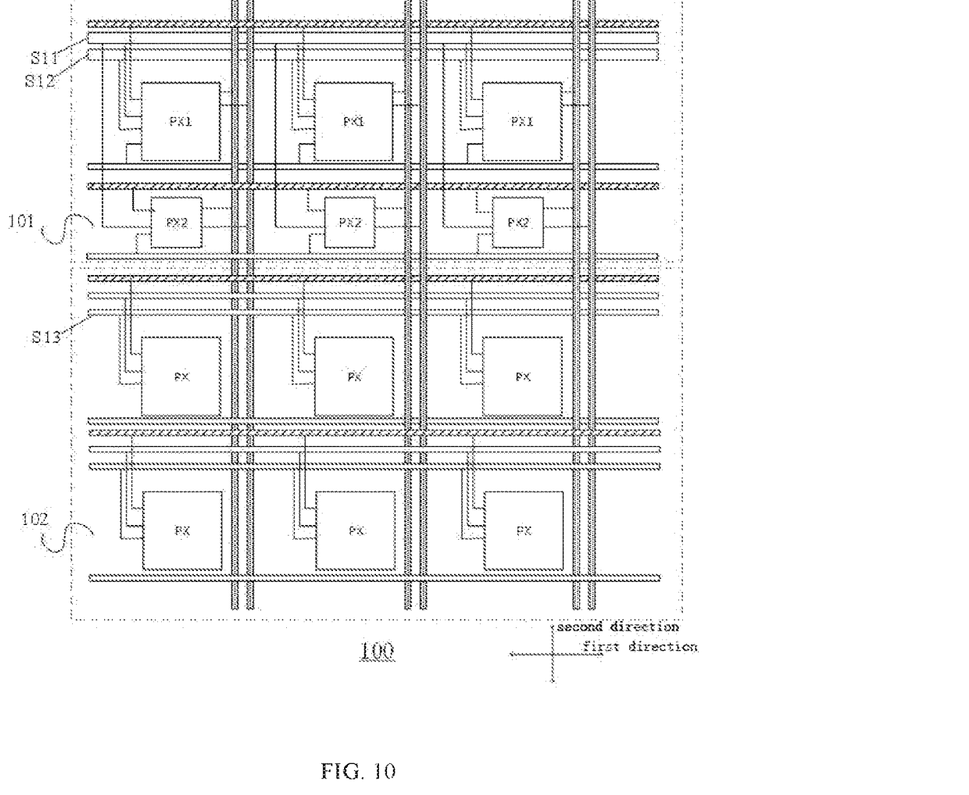
FIG. 10 is another schematic diagram showing the display panel in FIG. 1.
Figure 11:
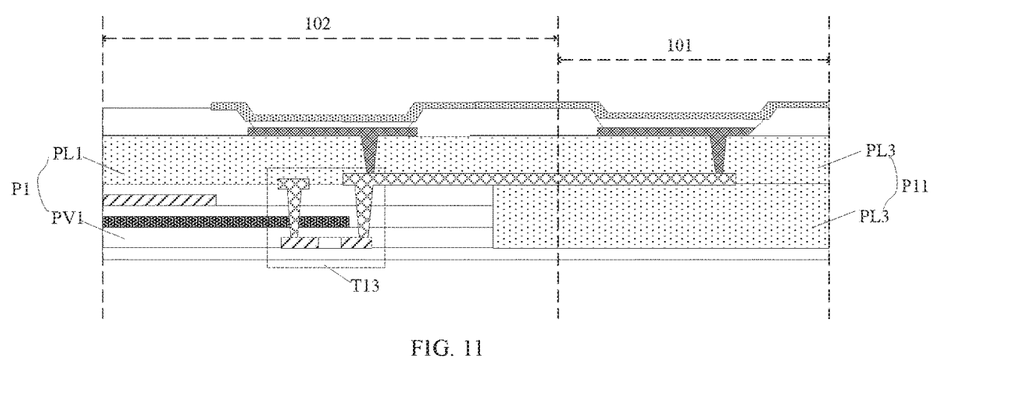
FIG. 11 is a cross-sectional view showing partial regions of the bending region 101 and a non-bending region 102 of the display panel in FIG. 1.

Regarding problems such as abnormal display easily generated in the bending region of the flexible display panel in the related art, the inventors of the present disclosure have intensively studied to provide a solution. As shown in FIGS. 1-11, FIG. 1 is a structural schematic diagram showing a display panel according to an embodiment of the present disclosure; FIG. 2 is a schematic diagram showing the display panel in FIG. 1 in a bent state; FIG. 3 is a schematic diagram showing the display panel in FIG. 1 in another bent state; FIG. 4 is another schematic diagram showing the display panel in FIG. 1; FIG. 5 is a schematic diagram showing a bending region 101 of the display panel in FIG. 1; FIG. 6 is a schematic diagram of a pixel drive circuit of the bending region 101 in FIG. 5; FIG. 7 is a schematic diagram showing a drive timing sequence of the pixel drive circuit in FIG. 6; FIG. 8 is a structural schematic diagram showing a partial region of the pixel drive circuit in FIG. 6; FIG. 9 is a schematic diagram showing an arrangement of the light-emitting units in the bending region 101 of the display panel in FIG. 1; FIG. 10 is another schematic diagram showing the display panel in FIG. 1; FIG. 11 is a cross-sectional view showing partial regions of the bending region 101 and a non-bending region 102 of the display panel in FIG. 1. The present disclosure provides a display panel and a display device. By simplifying the design of a part of a pixel drive circuit on a drive array substrate in a bending region of the display panel, the number of drive transistor and other switching control tubes having the largest area in a partial region of the pixel drive circuit is reduced. Moreover, by removing an inorganic insulation layer having a larger stress, an organic buffer layer having a larger elastic modulus is filled instead. Therefore, the bending region has good bendability or foldability.

As shown in FIGS. 1-11, an embodiment of the present disclosure provides a display panel 100 including a bending region 101 and a non-bending region 102. The bending region 101 means that the display panel can be bent at different angles along a direction of a folding axis X-X'. As shown in FIG. 2, when the display panel 100 is completely symmetrically folded along the folding axis, the size of the display panel is reduced to half the size of the display panel of an unfolded state. In one embodiment, as shown in FIG. 3, the display panel 100 can be folded along the folding axis in accordance with a folding mechanism (not shown in FIG. 3), and the bending portion 101 in a folded state presents an arc structure. In the embodiments of the present disclosure, the display panel can be folded toward the display screen, which can be simply referred to as "inward-folding"; and the display panel can also be folded facing away from the display screen, which can be referred to as "outward-folding". The display panel in the embodiments of the present disclosure can be folded or bent, because the flexible base substrate used in the display panel 100 can achieve the flexibility and bendability of the display panel in the embodiments of the present disclosure. Although a flexible base substrate is used, for regions having a high requirement on bending angles, e.g., a bending region 101, there is still internal stress accumulation and external pressure squeeze which may cause damage to the components in the display unit, thereby causing a problem of non-uniform display.

The presence of the internal stress of the display panel 100 is often a major reason to damage the display unit. The display panel includes a plurality of metal traces formed by patterning a metal layer. The insulation layer between the metal trace film layers is generally an inorganic insulation layer. Generally, the inorganic insulation layer is a dense inorganic film layer formed by depositing silicon nitride, silicon oxide or silicon oxynitride through a CVD process. Since the inorganic film layer has a large density, when the display panel is bent, the inorganic film layer is very likely to generate stress. When the stress is too large, problems such as cracking may occur, thereby affecting the arrangement of the metal traces and causing problems of open circuits or short circuits. In addition, since the display panel has a stacked array structure, if the inorganic insulation layer is broken, it is very easy to adversely affect the performance of the light-emitting component. In addition, each of the display units includes a pixel drive circuit including a plurality of transistors (e.g., thin film transistors, TFT). The area ratio of the drive transistor is very large, therefore the corresponding stacked semiconductor layers and the area of the metal traces is also very large. With such an arrangement, since a plurality of conductive film layers are stacked, an internal stress is generated. Based on the above reasons, the inventors have provided a display panel 100 by intensive research and analysis. As shown in FIGS. 4-6, a plurality of first display units 110 (such as an elliptical dotted block in FIG. 4) and a plurality of second display units 210 (such as an elliptical dotted block in FIG. 4) are included in the bending region 101 (shown by a rectangular dotted block in FIG. 4) of the display panel 100. It should be noted that FIG. 4 only shows a group of first display units and second display units, and the actual product includes a plurality of groups. Referring to FIG. 4, each of the first display units 110 at least includes a first light-emitting component D11 being an OLED light-emitting diode in the embodiments of the present disclosure. Each of the second display units 210 at least includes a second light-emitting component D21 being an OLED light-emitting diode in the embodiments of the present disclosure. As shown in FIG. 5, the first light-emitting component D11 in the first display unit 110 is the first pixel drive unit PX1 arranged corresponding thereto; and the second light-emitting component D21 in the second display unit 210 is the second pixel drive unit PX2 arranged corresponding thereto.

It should be noted that the first pixel drive unit PX1 and the second pixel drive unit PX2 are formed on the drive array substrate of the display panel. In the embodiments of the present disclosure, the pixel drive unit can be understood as a pixel drive circuit that drives and controls light-emitting or display of the light-emitting component. In addition, the first light-emitting component D11 and the second light-emitting component D21 are a plurality of OLED light-emitting diodes formed on the drive array substrate by an evaporation process.

In addition, in the embodiments of the present disclosure, the first display unit 110 and the second display unit 210 are adjacently arranged in a second direction. As shown in FIG. 5, the first pixel drive unit PX1 and the second pixel drive unit PX2 in the first display unit 110 are arranged adjacently in the second direction (that is, in the column direction), that is, they are arranged along the extending direction of the data signal line DL in the display panel 100. The pixel drive circuits in the embodiments of the present disclosure are arranged in a matrix arrangement on the drive array substrate, but the arrangement manner of the light-emitting components is different from the arrangement manner of the pixel drive circuits. In the embodiments of the present disclosure, there may have various arrangement manners of the light-emitting components, which is not limited to the manner provided by the embodiments of the present disclosure.

Referring to FIGS. 5 and 6, in the embodiments of the present disclosure, a first drive transistor T13 is included in the first pixel drive unit PX1 of the first display unit 110, and the first drive transistor T13 drives the first light-emitting component D11 to emit light. The second pixel drive unit PX2 of the second display unit 210 drives the second light-emitting component D21 to emit light through the first drive transistor T13 by using the first drive transistor T13 in the first pixel drive unit PX1. In the embodiments of the present disclosure, the first light-emitting component D11 and the second light-emitting component D21 in the first display unit 110 and the second display 210 adjacent to each other emit light having a same color, and the light may have a light color such as red, green or blue. On the basis of this, the first drive transistor T13 is shared to generate a drive current to drive both the first light-emitting component D11 and the second light-emitting component D21, and the light having a same brightness is realized by the light-emitting control signals having different timing sequences, but the light from D11 and D21 is not emitted at same time, thereby achieving the normal display of the bending region.

Referring to FIGS. 5 and 6, in the embodiments of the present disclosure, the first pixel drive unit PX1 of the first display unit 110 includes a first drive transistor, a plurality of switch transistors, and a first storage capacitor. The second pixel drive unit PX2 of the second display unit 210 includes a plurality of switch transistors and a second storage capacitor. The specific circuit configuration and operation principle of the first pixel drive unit PX1 and the second pixel drive unit PX2 will be explained in detail as follows.

As shown in FIGS. 6 and 7, the first pixel drive unit PX1 includes a plurality of switch transistors T11, T12, T14, T15, T16, T17, a first drive transistor T13 electrically connected to the plurality of switch transistors, and the first storage capacitor C11. The drive transistor supplies a drive current to the first light-emitting component D11 in order to enable it to emit light having a corresponding color. A connection manner of the first drive transistor T13 and the plurality of switch transistors will be described in detail below.

For the first drive transistor T13, the gate electrode of the first drive transistor T13 is electrically connected to the drain electrode of the fifth switch transistor T15; the source electrode of the first drive transistor T13 is electrically connected to the drain electrode of the first switch transistor T11 and the drain electrode of the second switch transistor T12; and the drain electrode of the first drive transistor T13 is electrically connected to the drain electrode of the fourth switch transistor T14 and the source electrode of the sixth switch transistor T16.

For the fourth switch transistor T14, the gate electrode of the fourth switch transistor T14 is electrically connected to the second scan control signal terminal Scan2, and its turn-on state and turn-off state are controlled by the second scan control signal; the source electrode of the fourth switch transistor T14 is electrically connected to the gate electrode of the first drive transistor T13. When the fourth switch transistor T14 is in a turn-on state, the gate electrode of the first drive transistor T13 may be conducted with the drain electrode of the first drive transistor T13 to form a substantial diode which generates a drive current to be provided to the first light-emitting component D11.

For the first switch transistor T11, the gate electrode of the first switch transistor T11 is electrically connected to the first light-emitting control signal terminal Emit11, and its turn-on state and turn-off state are controlled by the first light-emitting control signal. The source electrode of the first switch transistor T11 is electrically connected to the first constant voltage signal terminal PVDD being a high level signal generally about +5V. The drain electrode of the first switch transistor T11 is electrically connected to the source electrode of the drive transistor T13.

For the first data writing transistor, that is, the second switch transistor T12, the gate electrode of the second switch transistor T12 is electrically connected to the first scan control signal terminal Scan1, and its turn-on state and turn-off state are controlled by the first scan control signal. The source electrode of the second switch transistor T12 is electrically connected to the data voltage signal terminal Data. The brightness and gray scale of the first light-emitting component D11 are determined according to the data voltage signal. The drain electrode of the second switch transistor T12 is electrically connected to the source electrode of the first drive transistor T13. When the second switch transistor T12 is in a turn-on state, the data voltage signal is written into the first drive transistor T13 through the second switch transistor T12.

For the first gate reset transistor, that is, the fifth switch transistor T15, the gate electrode of the fifth switch transistor T15 is electrically connected to the first scan control signal terminal Scan1, and its turn-on state and turn-off state are controlled by the first scan control signal. The source electrode of the fifth switch transistor T15 is electrically connected to the reset signal terminal Vref. The drain electrode of the fifth switch transistor T15 is electrically connected to the gate electrode of the first drive transistor T13. When the fifth switch transistor T15 is in a turn-on state, the reset signal is written into the first drive transistor T13 through the fifth switch transistor T15 so as to provide reset the first drive transistor T13, thereby clearing the residual data signals in a previous frame. Generally, the reset signal Vref may be a zero voltage or a negative voltage. In the embodiments of the present disclosure, the reset signal Vref may be preferable to be a negative voltage such as about −5 V, in order to achieve a reset operation without excessively large cross-over voltage in the first drive transistor T13 which may cause drifting of the transistor, thereby affecting the normal light emission of the first light-emitting component D11.

For the first light-emitting control transistor, that is, the sixth switch transistor T16, the gate electrode of the sixth switch transistor T16 is electrically connected to the first light-emitting control signal terminal Emit1, and its turn-on state and turn-off state are controlled by the first light-emitting control signal. The drain electrode of the sixth switch transistor T16 is electrically connected to the anode of the first light-emitting component D11. The source electrode of the sixth switch transistor T16 is connected to the drain electrode of the first drive transistor T13. When the sixth switch transistor T16 is in a turn-on state, the drive current generated by the first drive transistor T13 is written into the first light-emitting component D11 through the sixth switch transistor T16 so as to drive D11 to emit light.

For the first anode reset transistor, that is, the seventh switch transistor T17, the gate electrode of the seventh switch transistor T17 is electrically connected to the first scan control signal terminal Scan1, and its turn-on state and turn-off state are controlled by the first scan control signal. The source electrode of the seventh switch transistor T17 is electrically connected to the reset signal terminal Vref. The drain electrode of the seventh switch transistor T17 is electrically connected to the anode of the first light-emitting component D11. When the seventh switch transistor T17 is in a turn-on state, the reset signal is written into the first light-emitting component D11 through the seventh switch transistor T17 so as to reset the first light-emitting component D1.

For the first storage capacitor C11, the first storage capacitor C11 is a parallel plate capacitor including a first electrode plate and a second electrode plate. The first electrode plate of the first storage capacitor C11 is electrically connected to the first constant voltage signal terminal PVDD, and the second electrode plate of the first storage capacitor C11 is electrically connected to the gate electrode of the first drive transistor T13 to provide charge storage.

For the second pixel drive unit PX2 electrically connected to the first pixel drive unit PX1, two switch transistors T21, T27 and a second storage capacitor C21 are included in PX2. The first drive transistor T13 supplies a drive current to the second light-emitting component D21 to enable it to emit light having a corresponding color. The connection manner of each of the switch transistors in the second pixel drive unit PX2 will be described in detail below.

For the second light-emitting control transistor T26, the gate electrode of the second light-emitting control transistor T26 is electrically connected to the second light-emitting control signal terminal Emit2, and its turn-on state and turn-off state are controlled by the second light-emitting control signal. The drain electrode of the second light-emitting control transistor T26 is electrically connected to the anode of the second light-emitting component D21. The source electrode of the second light-emitting control transistor T26 is connected to the drain electrode of the first drive transistor T13. When the second light-emitting controlling transistor T26 is in a turn-on state, the drive current generated by the first drive transistor T13 is written into the second light-emitting component D21 through the second light-emitting control transistor T26 so as to drive D21 to emit light.

For the second anode reset transistor T27, the gate electrode of the second anode reset transistor T27 is electrically connected to the first scan control signal terminal Scan1, and its turn-on state and turn-off state are controlled by the first scan control signal. The source electrode of the second anode reset transistor T27 is electrically connected to the reset signal terminal Vref. It should be noted that the reset signal in the first pixel drive unit PX1 is identical to the reset signal in the second pixel drive unit PX2. The drain electrode of the second anode reset transistor T27 is electrically connected to the anode of the second light-emitting component D21. When the second anode reset transistor T27 is in a turn-on state, the reset signal is written into the second light-emitting component D21 through the second anode reset transistor T27 so as to reset the second light-emitting component D21.

For the second storage capacitor C21, the second storage capacitor C21 is a parallel plate capacitor including a third electrode plate and a fourth electrode plate. The third electrode plate of the second storage capacitor C21 is electrically connected to the first constant voltage signal terminal PVDD, and the second electrode plate of the second storage capacitor C21 is electrically connected to the source electrode of the second light-emitting control transistor T26 so as to provide charge storage for a node formed between the second light-emitting control transistor T26 and the first drive transistor T13. Therefore, the drive current generated by the first drive transistor T13 can be stably input into the second light-emitting component D21.

In addition, it should be noted that both of the cathodes of the first light-emitting component D11 and the second light-emitting component D21 are provided with a constant low level signal by the second constant signal terminal PVEE.

In summary, in the embodiments of the present disclosure, the second pixel drive unit PX2 electrically connected to the first pixel drive unit PX1 realizes that two adjacent display units share one drive transistor to reduce the number of the drive transistors and other switch transistors in the second pixel drive unit PX2. Meanwhile, the first light-emitting component D11 in the first display unit 110 and the second light-emitting component D21 in the second display unit 210 may be required to emit light in different timing sequences. In the embodiments of the present disclosure, the above object is realized by using different light-emitting control signals for both of them.

As shown in FIGS. 6 and 7, the first light-emitting component D11 is controlled by the first light-emitting control signal Emit1; the second light-emitting component D21 is controlled by the second light-emitting control signal Emit2; and the first light-emitting control signal Emit1 and the second light-emitting control signal Emit2 are different pulse signals. When the first light-emitting control signal Emit1 is a high level signal, the second light-emitting control signal Emit2 is a low level signal. When the first light-emitting control signal Emit1 is a low level signal, the second light-emitting control signal Emit2 is a high level signal. That is to say, the first light-emitting component D11 and the second light-emitting component D21 emits light in different timing sequences. Each of the first light-emitting control signal Emit1 and the second light-emitting control signal Emit2 has a plurality of pulse signals in a frame of display image. In the embodiments of the present disclosure, in a frame of display image, the first light-emitting control signal Emit1 may have 3 to 6 low-level signal phases, and the second light-emitting control signal Emit2 may have 3 to 6 low-level signal phases. That is to say, the light-emitting control signal can operated in a time-division light-emission mode to achieve display.

Referring to FIG. 7, the specific working processes of the first pixel drive unit PX1 and the second pixel drive unit PX2 will be respectively explained.

At an initialization phase S01, a low level signal is provided by the first scan control signal Scan1 (the second scan control signal Scan2, the first light-emitting control signal Emit1, and the second light-emitting control signal Emit2 are in a high level state). A corresponding switch transistor (the transistor in the embodiments of the present disclosure is exemplified by a P-MOS transistor, but is not limited thereto) controlled by the low level signal is in a turn-on state. The first drive transistor and the light-emitting component are reset by a reset signal Vref.

In a data writing phase S02, a low level signal is provided by the second scan control signal Scan2 (the first scan control signal Scan1, the first light-emitting control signal Emit1, and the second light-emitting control signal Emit2 are in a high level state). A corresponding switch transistor (the transistor in the embodiments of the present disclosure is exemplified by a P-MOS transistor, but are not limited thereto) controlled by the low level signal is in a turn-on state. The data drive signal Data is written into the first drive transistor for threshold acquisition and generation of a drive current.

In a first light-emitting phase S03, a low level signal is provided by the first light-emitting control signal Emit1 (the first scan control signal Scan1, the second scan control signal Scan2, and the second light-emitting control signal Emit2 are in a high level state). The first light-emitting transistor T17 (the transistor in the embodiments of the present disclosure is exemplified by a P-MOS transistor, but is not limited thereto) controlled by the low level signal is in a turn-on state. The light-emitting current is written into the first light-emitting component D11 so that the first light-emitting component D11 emits light.

In a second lighting phase S03', a low level signal is provided by the second light-emitting control signal Emit2 (the first scanning control signal Scan1, the second scanning control signal Scan2, and the first light-emitting control signal Emit1 are in a high level state). The second light-emitting component T27 (the transistor in the embodiments of the present disclosure is exemplified by a P-MOS transistor, but is not limited thereto) controlled by the low level signal is in a turn-on state. The light-emitting current is written in the second light-emitting component D21 so that the second light-emitting component D21 emits light.

It should be noted that, in a frame of display image, the first light-emitting phase S03 and the second light-emitting phase S03' are alternately performed, thereby realizing the time-division light emission of the first light-emitting component D11 in the first display unit 110 and the second light-emitting component D21 in the second display unit 210 so as to achieve normal display.

The implementation manner of the first display unit 110 and the second display unit 210 sharing the first drive transistor T13 in the pixel circuit is described as above, and then the corresponding implementation of the partial connection mode of the first display unit 110 and the second display unit 210 regarding the panel structure will be described.

As shown in FIG. 8, the anode D110 of the first light-emitting component D11 in the first display unit 110 is connected to the source electrode 131 of the first drive transistor T13 through a through hole, and the anode D210 of the second light-emitting component D21 is connected to the source electrode 131 of the first drive transistor T13 through a through hole, so that the first drive transistor T13 can drive both of the first light-emitting component D11 and the second light-emitting component D21.

In the embodiments of the present disclosure, an arrangement manner of the light-emitting components corresponding to the first display unit 110 and the second display unit 210 can be referred to FIG. 9. In the embodiments of the present disclosure, the first display unit 110 may include: a first red display unit R1 and a second red display unit R2 electrically connected to the first red display unit R1 (the specific connection manner is described as above, which is not elaborated herein, only represented by the dotted line connection in FIG. 9); a first green display unit G1 and a second green display unit G2 electrically connected to the first green display unit G1; and a first blue display unit B1 and a second blue display unit B2 electrically connected to the first blue display unit B1. It can be understood that, in the embodiments of the present disclosure, the first red display unit R1, the first green display unit G1, and the first blue display unit B1 constitute a first pixel; the second red display unit R2, the second green display unit G2 and the second blue display unit B2 constitute a second pixel. A pixel group is composed of a first pixel and a second pixel. A plurality of pixel groups arranged in an array is included in the display panel. In addition, it should be noted that, in the embodiments of the present disclosure, as shown in FIG. 9, only one arrangement manner of the display unit is shown, but it is not limited thereto.

On the basis of the above embodiments, the arrangement manners of the signal lines corresponding to the first display unit and the second display unit will be explained below. Referring to FIG. 5, in the embodiments of the present disclosure, for the first display unit 110 (as shown by an elliptical dotted block in FIG. 5), for the first pixel drive unit PX1 in the first display unit 110, a plurality of signal traces may be required to provide corresponding enable signals thereto. The first region where the first display unit 110 is located is provided with a first scan signal line S11, a second scan signal line S12, a first reset signal line V11 and a first light-emitting control signal line E11 extending along the first direction. The second region where the second display unit 210 is located is only provided with the second light-emitting control signal line E21 and the second reset signal line V21 extending in the first direction, without the first scan signal line S11 or the second scan signal line S12. In addition, the data signal line DL and the first constant voltage line VL arranged in the second direction are also provided in the display panel.

It should be noted that the first scan signal line S11 provides the first scan signal Scan1 to both the first pixel drive unit PX1 and the second pixel drive unit PX2; the second scan signal line S12 provides the second scan signal Scan2 to both the first pixel drive unit PX1 and the second pixel drive unit PX2; the first reset signal line VI 1 and the second reset signal line V21 respectively provide the reset signal Vref to the first pixel drive unit PX1 and the second pixel drive unit PX2; the first light-emitting control signal line E11 provides the first light-emitting control signal Emit1 to the first pixel drive unit PX1; the second light-emitting control signal line E21 provides the second light-emitting control signal Emit2 to the second pixel drive unit PX2; and the data signal line DL and the first constant voltage line VL provide the data signal Data and the first constant voltage signal PVDD to the first pixel drive unit PX1 and the second pixel drive unit PX2, respectively.

Referring to FIG. 5, in the bending region 101, a plurality of first display units 110 is sequentially arranged along the first direction, and a plurality of second display units 210 is sequentially arranged along the first direction; and the first display unit 110 and the second display unit 210 are alternatively arranged in the second direction intersecting with the first direction. Briefly, along the second direction, if the first display unit 110 extending in the first direction is arranged in the first row of the drive array substrate of the display panel, the second display unit 210 extending in the first direction is arranged in the second row of the drive array substrate of the display panel; the above arrangement is repeated as such. The main reason for the above arrangement is to separately form regions having a small internal stress and a good anti-bending performance in the bending region, that is, the region where the second display unit is located. The region having a large internal stress where the first display unit is located and the region having a small internal stress where the second display unit is located are arranged in an alternative manner, thereby reducing the internal stress in the entire bending region.

Some implementation manners are described in detail below.

As shown in FIGS. 5 and 6, in the first display unit 110 and the second display unit 210 of the bending region, each of the number of transistors and the number of signal traces in the second display unit 210 is much less than the number of transistors and the number of signal traces in the first display unit 110, so that the necessary film structure basis is provided to enhance the anti-bending performance of the bending region. As shown in FIG. 11, in the embodiments of the present disclosure, the display panel includes a first insulation layer. In the non-bending region 102 of the display panel, the first insulation layer P1 at least includes a first inorganic layer PV 1 and a first organic layer PL1. The first inorganic layer PV 1 is an inorganic film layer formed by depositing silicon nitride, silicon oxide or silicon oxynitride through a CVD process. The first inorganic layer PV 1 is generally arranged between two metal layers due to requirement of the process, and has very good insulation performance.

In the embodiments of the present disclosure, in the region where the second unit in the bending region 101 is located, since the drive transistor having a large area is not provided and the number of the metal signal traces is set very small as described above, this entire region can be filled the organic polymer material having good anti-bending performance, such as a PI material having a high elastic modulus to form a first insulation layer P11 having only the third organic layer PL3. The thickness of the third organic layer is greater than the thickness of the first organic layer. Through the arrangement of the third organic layer, the bending region has excellent anti-bending performance and a plurality of stress releasing points are formed, so that the internal stress of the display panel can be perfectly released, thereby achieving stable anti-bending performance of the display panel. Therefore, the radius of curvature of the bend of the display panel is between 0.3 mm and 1.0 mm, so that bending at any angle can be achieved to present a good user experience.

On the basis of the above embodiments, the design of the scan lines in the bending region and the non-bending region of the display panel is intensively studied in this embodiment of the present disclosure. By differential design of the scan lines in the bending region and the non-bending region, the loads on the scan lines are consistent, and an excellent display image is achieved, thereby avoiding non-uniform display.

As shown in FIG. 10, the first scan line S11 and the second scan line S12 in the bending region 101 have a first width and a second width respectively. In the bending region, the first scan line S11 and the second The scan line S12 is not only to provide a scan signal to a corresponding row of the first pixel drive units PX1 in the first display unit, but also to provide a scan signal to the second pixel drive units PX2.

In contrast, the third scan line S13 in the non-bending region 102 may only be required to provide a scan signal to a corresponding row of the third pixel drive circuits PX. Therefore, loads on the first scan line S11 and the second scan line S12 is much larger than load on the third scan line S13. In order to achieve uniformity of the display image, loads on the bending region and on the non-bending region are balanced. The inventors have intensively studied that the first width of the first scan line S11 is set between 3 μm and 6 μm; the second width of the second scan line S12 is set between 3 μm and 6 μm; the third width of the third scan line S131 is set between 1 μm and 3 μm; and the width of the third scan line S131 is smaller than the width of the first scan line S11 and/or the second scan line S12. Therefore, by increasing the width of the first scan line S11 and the second scan line S12, that is, by reducing the corresponding resistance, the loads on the scan line of the bending region and the non-bending region are balanced, so that display uniformity of the display panel is achieve and Mura phenomenon is avoided.

In addition, as shown in FIGS. 5 and 10, in the display panel 100, the area ratio of the first pixel drive unit PX1 occupied in the first display unit 110 in the bending region 101 is approximately equal to or smaller than the area ratio of the third pixel drive unit PX3 occupied in the non-bending region 102. However, the area ratio of the second pixel drive unit PX2 occupied in the second display unit 210 in the bending region 101 is smaller than the area ratio of the first pixel drive unit PX1 occupied. Therefore, the bending region having good anti-bending performance is achieved.

Figure 12:
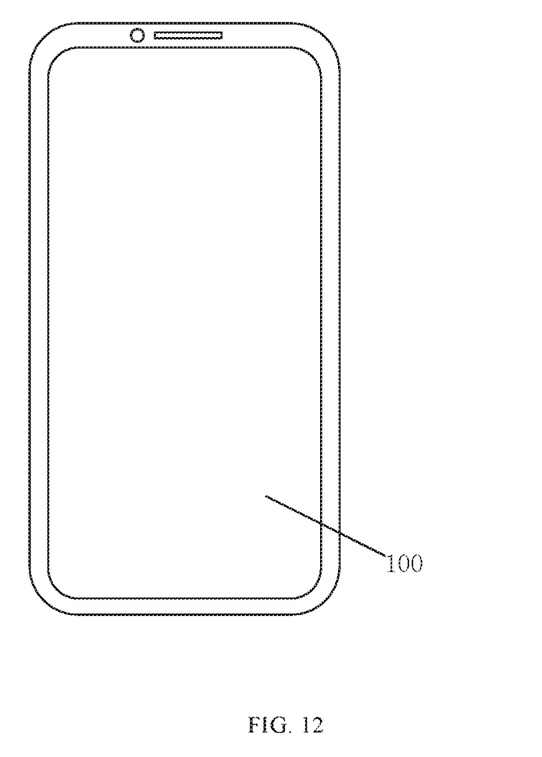
FIG. 12 is a structural schematic diagram showing a display device according to an embodiment of the present disclosure.

An embodiment of the present disclosure further provides a display device. FIG. 12 is a structural schematic diagram showing a display device according to an embodiment of the present disclosure. The display device includes the display panel 100 described above. The specific structure of the display panel 100 has been described in detail in the above embodiments, which is not elaborated herein. The display device shown in FIG. 12 is merely illustrative, and the display device may be any electronic device having a display function such as a mobile phone, a tablet computer, a laptop computer, an electronic paper book, or a television.

Since the display device provided by the embodiments of the present disclosure includes the above display panel, with the display device, by simplifying the design of a part of a pixel drive circuit on a drive array substrate in a bending region of the display panel, the number of a drive transistor and other switching control tubes having the largest area in a partial region of the pixel drive circuit are reduced. Moreover, by removing an inorganic insulation layer having a larger stress, an organic buffer layer having a larger elastic modulus is filled. Therefore, the bending region has good bendability or foldability.

What is claimed is:

1. A display panel, comprising:
  a bending region, wherein the bending region comprises a first display unit and a second display unit, and the bending region is a region of the display panel is configured to be bent at different angles along a direction of a folding axis;
  wherein the first display unit comprises:
    a first pixel drive unit and a first light-emitting component arranged corresponding to the first pixel drive unit, and the first pixel drive unit comprises a first drive transistor configured to drive the first light-emitting component to emit light; and
  wherein the second display unit at least comprises:

a second pixel drive unit and a second light-emitting component arranged corresponding to the second pixel drive unit; and the first drive transistor is further configured to drive the second light-emitting component to emit light;

wherein the display panel comprises:

a first scan signal line arranged only in a first region of the bending region where the first display unit is located, wherein the first scan signal line is electrically connected to the first light-emitting component and the second light-emitting component that are located only in the bending region, and configured to provide a first scan signal to the first pixel drive unit and the second pixel drive unit; and a second scan signal line only arranged in the first region of the bending region, wherein only in the bending region, the second scan signal line is electrically connected to the first light-emitting component, and configured to provide a second scan signal to the first pixel drive unit.

2. The display panel according to claim 1, wherein the first drive transistor generates and provides a drive current to the first light-emitting component and the second light-emitting component, so that the first light-emitting component and the second light-emitting component emit light;

the first light-emitting component and the second light-emitting component have a same light-emission brightness; and the first light-emitting component and the second light-emitting component emit light having a same color.

3. The display panel according to claim 2, wherein the first light-emitting component is controlled by a first light-emitting control signal; the second light-emitting component is controlled by a second light-emitting control signal; and the first light-emitting control signal and the second light-emitting control signal are different pulse signals.

4. The display panel according to claim 3, wherein the second light-emitting control signal is a low level signal when the first light-emitting control signal is a high level signal; and the second light-emitting control signal is a high level signal when the first light-emitting control signal is a low level signal.

5. The display panel according to claim 1, wherein the first pixel drive unit comprises a first light-emitting control transistor, wherein a gate electrode of the first light-emitting control transistor is connected to a signal terminal providing the first light-emitting control signal; a drain electrode of the first light-emitting control transistor is connected to an anode of the first light-emitting component; and a source electrode of the first light-emitting control transistor is connected to a drain electrode of the first drive transistor; and the second pixel drive unit comprises a second light-emitting control transistor, wherein a gate electrode of the second light-emitting control transistor is connected to a signal terminal providing the second light-emitting control signal; and a drain electrode of the second light-emitting control transistor is connected to an anode of the second light-emitting component; and a source electrode of the second light-emitting control transistor is connected to the drain electrode of the first drive transistor.

6. The display panel according to claim 5, wherein the first pixel drive unit comprises a first anode reset transistor controlled by the first scan signal; and the second pixel drive unit comprises a second anode reset transistor controlled by the first scan signal.

7. The display panel according to claim 6, wherein a gate electrode of the first anode reset transistor is connected to a signal terminal providing the first scan signal; a source electrode of the first anode reset transistor is connected to a signal terminal providing a reset signal; and a drain electrode of the first anode reset transistor is connected to the anode of the first light-emitting component; and a gate electrode of the second anode reset transistor is connected to the signal terminal providing the first scan signal; a source electrode of the second anode reset transistor is connected to the signal terminal providing the reset signal; and a drain electrode of the second anode reset transistor is connected to the anode of the second light-emitting component.

8. The display panel according to claim 5, wherein the first pixel drive unit comprises a first storage capacitor comprising a first electrode plate and a second electrode plate, wherein the first electrode plate is connected to a signal terminal providing a first constant voltage; and the second electrode plate is connected to a gate electrode of the first drive transistor; and the second pixel drive unit comprises a second storage capacitor comprising a third electrode plate and a fourth electrode plate, the third electrode plate is connected to the signal terminal providing the first constant voltage, and the fourth electrode plate is connected to the source electrode of the second light-emitting control transistor.

9. The display panel according to claim 5, wherein the first pixel drive unit further comprises a first gate reset transistor, wherein a gate electrode of the first gate reset transistor is connected to a signal terminal providing the first scan signal; a source electrode of the first gate reset transistor is connected to a signal terminal providing a reset signal; and a drain electrode of the first gate reset transistor is connected to a gate electrode of the first drive transistor.

10. The display panel according to claim 5, wherein the first pixel drive unit further comprises a first data writing transistor, wherein a gate electrode of the first data writing transistor is connected to a signal terminal providing a second scan signal; a source electrode of the first data writing transistor is connected to a signal terminal providing a data voltage signal; and a drain electrode of the first data writing transistor is connected to a source electrode of the first drive transistor.

11. The display panel according to claim 1, wherein no first scan signal line is arranged in a second region where the second display unit is located; and the first scan signal line has a first width in a range of 3 µm-6 µm.

12. The display panel according to claim 11, wherein no second scan signal line is arranged in the second region where the second display unit is located; and the second scan signal line has a second width in a range of 3 µm-6 µm.

13. The display panel according to claim 12, wherein the display panel further has a non-bending region, wherein a third scan line having a third a width is arranged in the non-bending region, and the third width is less than the first width or the second width.

14. The display panel according to claim 1, further comprising a first insulation layer;

wherein the display panel further has a non-bending region, wherein the first insulation layer in the non-bending region comprises a first inorganic layer and a first organic layer;

in a portion of the bending region where the second display unit is located, the first insulation layer only comprises a third organic layer; and a thickness of the third organic layer is greater than a thickness of the first organic layer.

15. The display panel according to claim 1, wherein the first display unit is repeated in a first direction;

the second display unit is repeated in the first direction; and the first display unit and the second display unit are alternately arranged in a second direction intersecting with the first direction.

16. The display panel according to claim 1, wherein the display panel comprises a flexible substrate, the display panel is a flexible and bendable display panel, and has a radius of curvature ranging from 0.3 mm to 1.0 mm.

17. A display device comprising:

a display panel, comprising:

a bending region, wherein the bending region comprises a first display unit and a second display unit, and the bending region is a region of the display panel is configured to be bent at different angles along a direction of a folding axis;

wherein the first display unit comprises:

a first pixel drive unit and a first light-emitting component arranged corresponding to the first pixel drive unit, and the first pixel drive unit comprises a first drive transistor configured to drive the first light-emitting component to emit light; and wherein the second display unit at least comprises:

a second pixel drive unit and a second light-emitting component arranged corresponding to the second pixel drive unit; and the first drive transistor is further configured to drive the second light-emitting component to emit light;

wherein the display panel comprises:

a first scan signal line arranged only in a first region of the bending region where the first display unit is located, wherein, the first scan signal line is electrically connected to the first light-emitting component and the second light-emitting component that are located only in the bending region, and configured to provide a first scan signal to the first pixel drive unit and the second pixel drive unit; and a second scan signal line only arranged in the first region of the bending region, wherein only in the bending region, the second scan signal line is electrically connected to the first light-emitting component, and configured to provide a second scan signal to the first pixel drive unit.

18. The display panel according to claim 3, wherein the second light-emitting control signal is a low level signal when the first light-emitting control signal is a high level signal.

19. The display panel according to claim 12, wherein the display panel further has a non-bending region, wherein a third scan line having a third a width is arranged in the non-bending region, and the third width is less than the first width.

* * * * *